United States Patent
Yamamoto et al.

(10) Patent No.: US 7,969,751 B2
(45) Date of Patent: Jun. 28, 2011

(54) HIGH-SPEED SIGNAL TRANSMISSION APPARATUS

(75) Inventors: Keiichi Yamamoto, Yamato (JP); Norio Chujo, Tokyo (JP); Takashi Kumakura, Hitachi (JP); Yosuke Ishimatsu, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 322 days.

(21) Appl. No.: 12/216,737

(22) Filed: Jul. 10, 2008

(65) Prior Publication Data

US 2009/0027867 A1   Jan. 29, 2009

(30) Foreign Application Priority Data

Jul. 23, 2007   (JP) .................. 2007-190758

(51) Int. Cl.
*H02B 1/26* (2006.01)
(52) U.S. Cl. .................. 361/826; 361/788; 361/796
(58) Field of Classification Search .................. 361/826, 361/827, 796, 788, 756; 211/41.17
See application file for complete search history.

(56) References Cited

U.S. PATENT DOCUMENTS

| | | | | |
|---|---|---|---|---|
| 5,245,613 A | * | 9/1993 | Takami et al. | 370/509 |
| 7,425,685 B1 | * | 9/2008 | Gundogan et al. | 174/520 |
| 7,515,427 B2 | * | 4/2009 | King et al. | 361/725 |
| 7,698,491 B1 | * | 4/2010 | King et al. | 710/306 |
| 2007/0230152 A1 | * | 10/2007 | Abe | 361/796 |

FOREIGN PATENT DOCUMENTS

| | | |
|---|---|---|
| JP | 7-221475 | 8/1995 |
| JP | 8-288663 | 11/1996 |

* cited by examiner

*Primary Examiner* — Dameon E Levi
(74) *Attorney, Agent, or Firm* — Antonelli, Terry, Stout & Kraus, LLP.

(57) ABSTRACT

A high-speed signal transmission apparatus comprises: a housing; a plurality of daughter boards juxtaposed to one another in the housing; board-side connectors each provided on corresponding each of the juxtaposed daughter boards; and cable-side connectors fixed in the housing; wherein each of the board-side connectors is insertable/removable into/from corresponding each of the cable-side connectors, and wherein a cable group whose impedance matching can be achieved makes connection between the predetermined cable-side connectors.

10 Claims, 11 Drawing Sheets

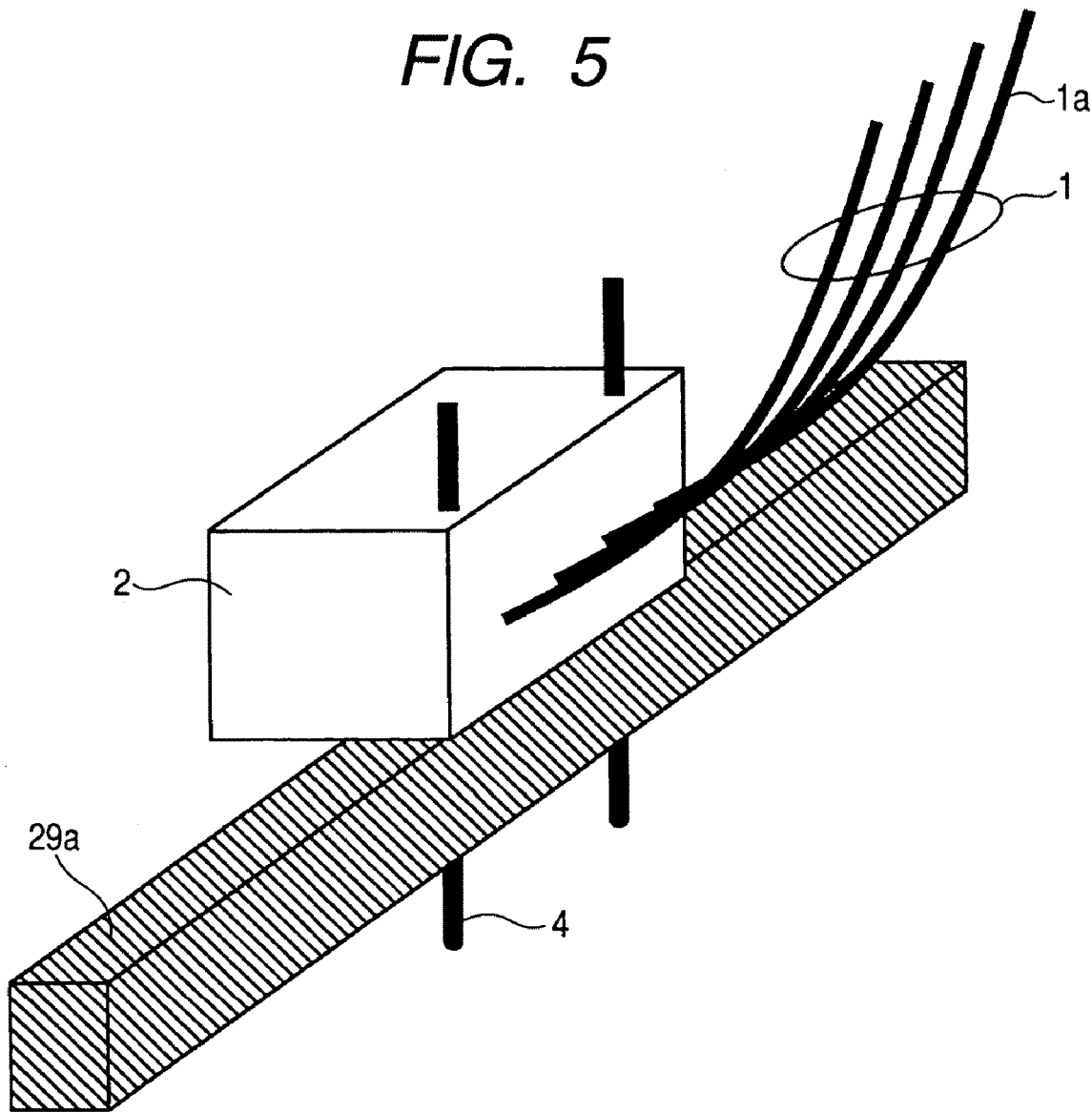

FIG. 7
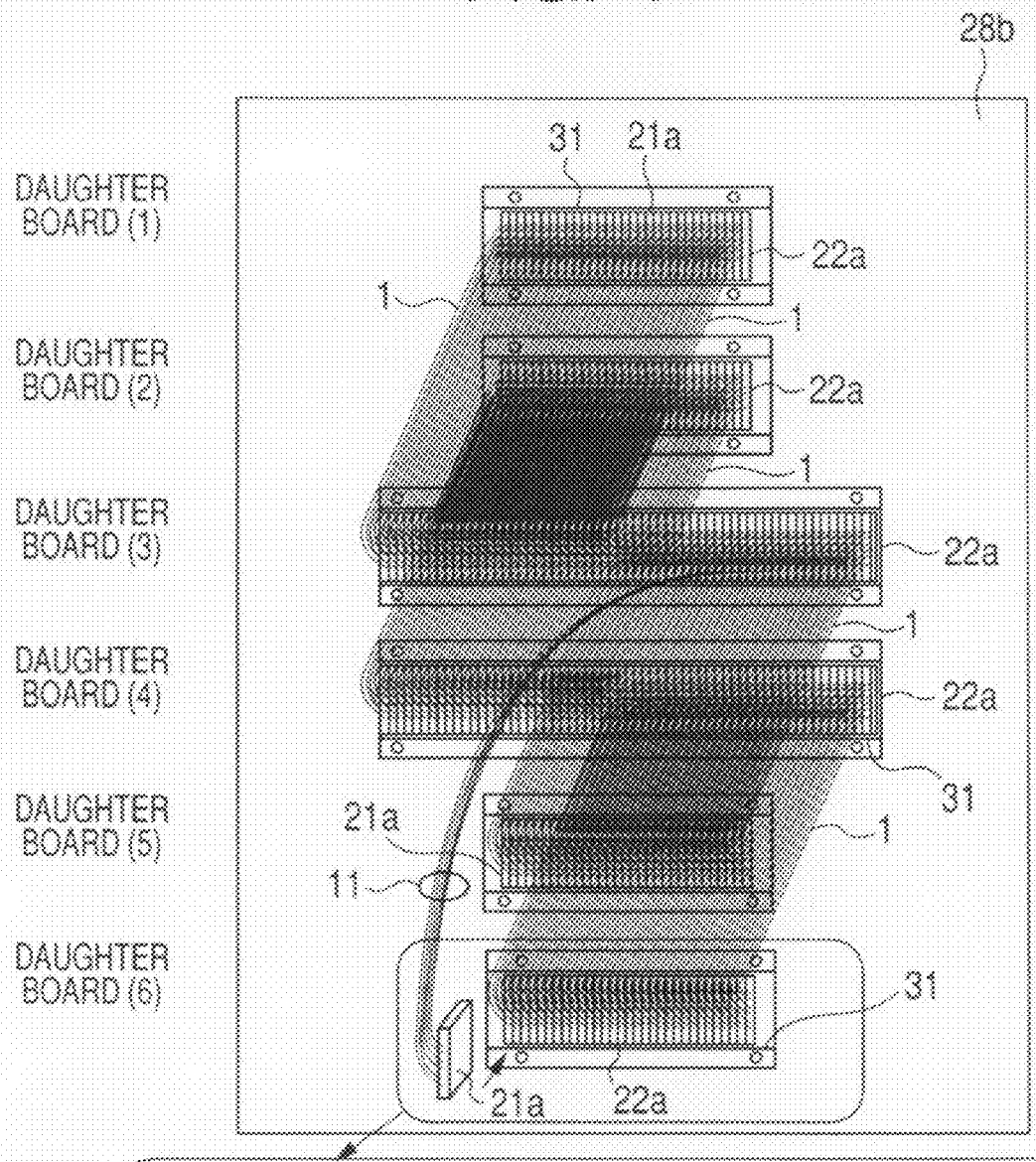
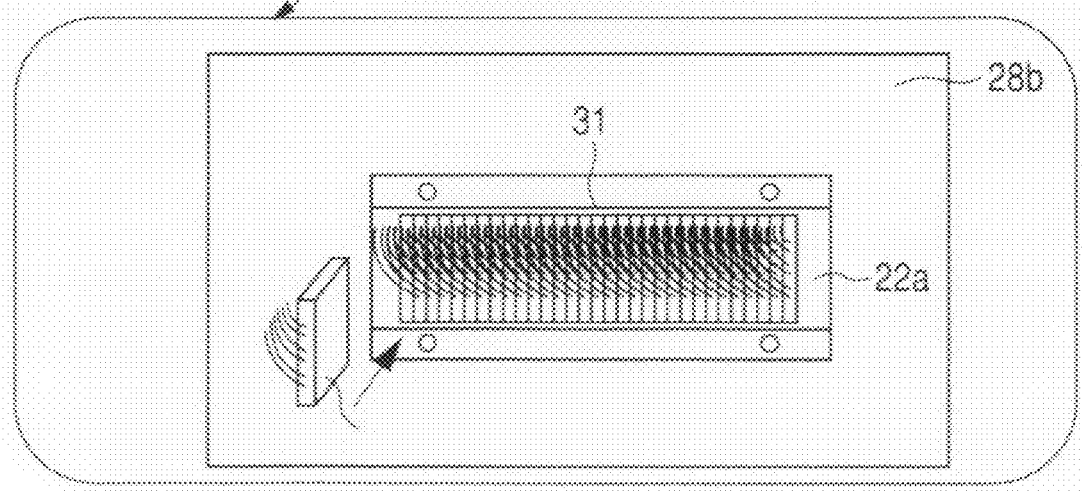

FIG. 9
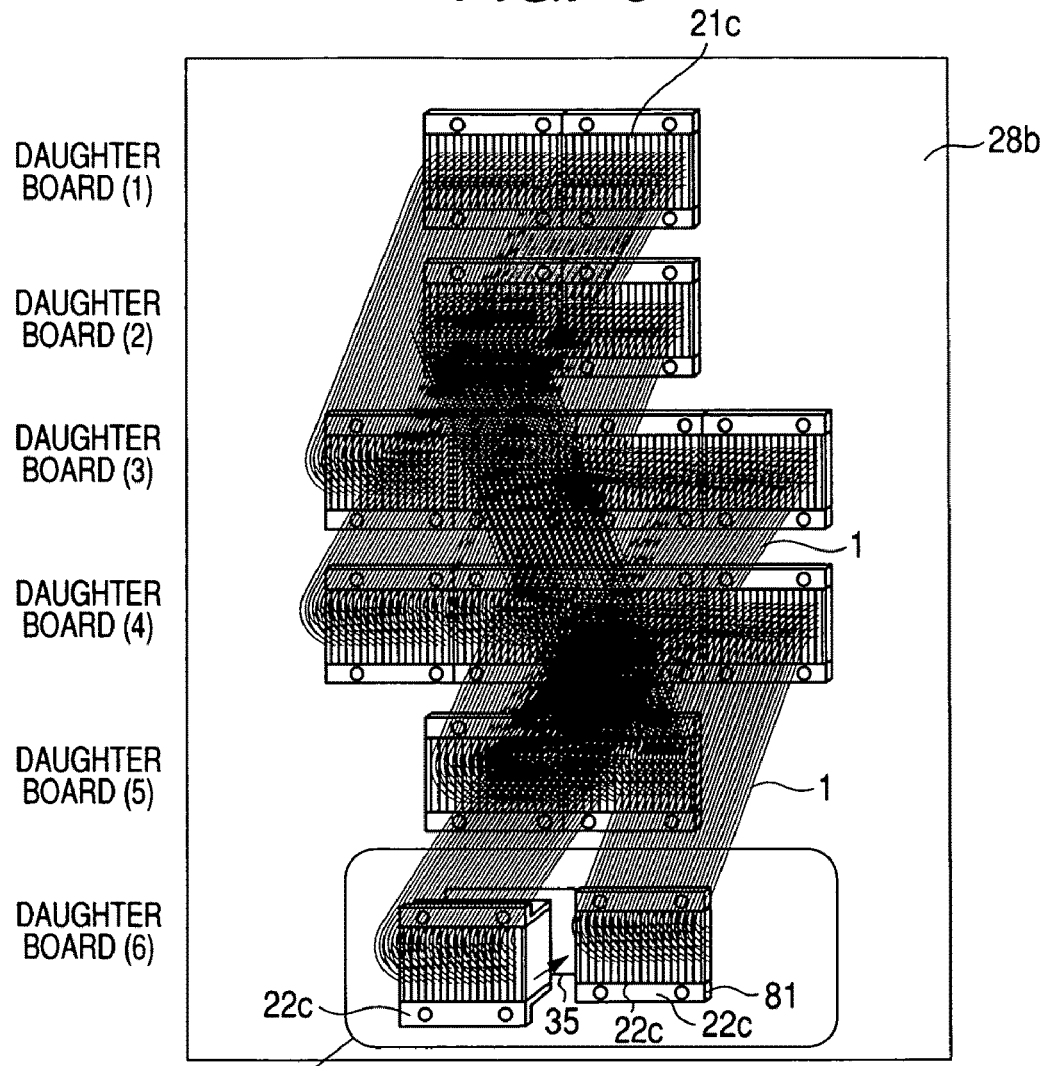
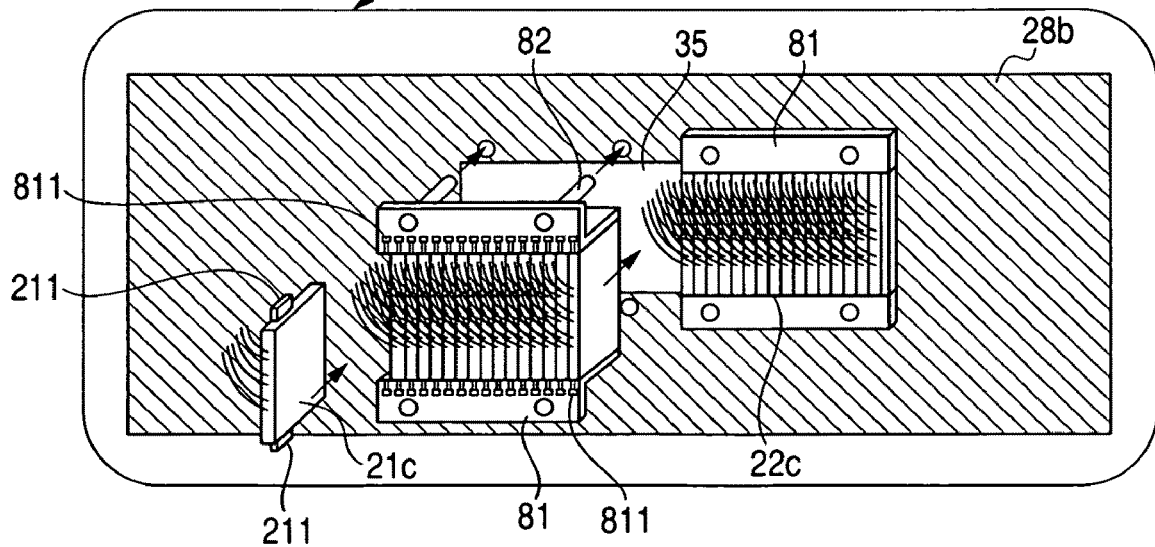

HIGH-SPEED SIGNAL TRANSMISSION APPARATUS

BACKGROUND OF THE INVENTION

The present invention relates to high-speed signal transmission apparatus such as a server, a router, a storage unit, or an image processing apparatus, the high-speed signal transmission apparatus being capable of transmitting a high-speed signal inside a housing thereof.

The conventional electronic equipment is known in JP-A-7-221475 (patent document 1). According to the patent document 1, a printed circuit board which is called a daughter board is provided with a CPU and a network port, and a connection between daughter boards is made by another printed circuit board which is called a backboard for information transfer. Thus, the backboard structure has the high maintainability. For example, if electronic equipment fails, it is possible to conveniently replace a daughter board.

In addition, the wiring system which uses a wiring housing is known in JP-A-8-288663 (patent document 2). According to the patent document 2, cables are used to connect between package-mounted housings so that the transmission is performed.

SUMMARY OF THE INVENTION

With the recent widespread use of the Internet, the performance of information processing apparatus such as a server or a router is becoming higher year by year. As a result, the signal processing speed inside the information processing apparatus is also becoming higher.

The problem with the method for transmitting a high-speed signal by use of a backboard described in the patent document 1 is that because board wirings are placed between large dielectrics of dielectric loss tangent, which is proper for the formation of a printed circuit board, a transmission loss occurs, disabling the signal transmission.

For example, when a high-speed signal of 10 Gbps is transmitted over the length of 1 m, the amplitude on the receiving side decreases to about $\frac{1}{50}$, and consequently, it is not possible to perform the signal transmission. In addition, another problem with the method described in the patent document 1 is that when several hundred signals are transmitted by use of one backboard, the number of wiring lines that can be formed on one layer is exceeded. Therefore, although the printed circuit board is formed with wirings having multiple layers, a via hole for connecting the wiring formed in an area close to a surface layer to the wiring of the surface layer becomes a stub having a resonance point at several GHz, which causes transmission characteristics to be degraded.

The problem with the method for transmitting a high-speed signal between package-mounted housings by use of cables described in the patent document 2 is that cable connectors located at both ends of a cable are not fixed at fixed positions, and therefore, unlike the backboard structure, it is not possible to freely insert and remove the connectors by moving only the daughter board side. In addition, another problem with the method described in the patent document 2 is that because a motherboard whose impedance matching is difficult to achieve is located between a package connector and a cable connector, a transmission loss occurs when a signal passes through the motherboard, which causes transmission characteristics to be degraded.

The present invention has been made to solve the above problems, and an object of the present invention is to provide a high-speed signal transmission apparatus such as a server or a router, the high-speed signal transmission apparatus being capable of: transmitting a high-speed signal with low loss; preventing transmission characteristics from being degraded by configuring each transmission line so that the impedance matching thereof can be easily achieved; and inserting and removing a connector by moving only the daughter board side.

According to one aspect of the present invention, there is provided a high-speed signal transmission apparatus comprising: a housing; a plurality of daughter boards juxtaposed to one another in the housing; board-side connectors each provided on corresponding each of the juxtaposed daughter boards; and cable-side connectors fixed in the housing; wherein each of the board-side connectors is insertable/removable into/from corresponding each of the cable-side connectors, and wherein a cable group whose impedance matching can be achieved makes connection between the cable-side connectors.

In addition, according to the present invention, the cable group is constituted of a plurality of coaxial cables or a plurality of twinax cables. In addition, according to the present invention, two or more sets of the board-side connectors and cable-side connectors into/from which the board-side connectors can be inserted/removed are provided for a predetermined daughter board; and a positioning mechanism for defining a position between the board-side connectors so as to be suitable for a spacing between the cable-side connectors, is provided in the housing.

In addition, according to the present invention, a daughter rail for guiding each of the plurality of daughter boards so that the board-side connectors can be inserted/removed into/from the cable-side connectors fixed in the housing, is provided in the housing, the board-side connector being provided (mounted) on each of the plurality of daughter boards.

In addition, according to the present invention, the each cable-side connector is formed by layering wafer-shaped connectors on one another. In addition, according to the present invention, the wafer-shaped connectors are layered on one another so that the layered wafer-shaped connectors are gathered together on a cable group basis to form a layered product, the cable group being used to connect between the cable-side connectors; and the layered product into which the wafer-shaped connectors are gathered together is positioned and mounted to a stationary plate that is fixed to the housing. In addition, according to the present invention, rod-shaped fixing members are inserted into a plurality of positioning holes, with which each of the wafer-shaped connectors is provided, so that the wafer-shaped connectors are layered on one another and gathered together on a cable group basis to form a layered product, the cable group being used to connect between the cable-side connectors; and the layered product into which the wafer-shaped connectors are gathered together is positioned and mounted to a stationary plate that is fixed to the housing.

In addition, according to the present invention, two or more sets of the board-side connectors and cable-side connectors into/from which the board-side connectors can be inserted/removed are provided for a predetermined daughter board; and the each cable-side connector is formed by layering wafer-shaped connectors on one another.

In addition, according to the present invention, the each board-side connector is formed by layering wafer-shaped connectors on one another with the polarity of the wafer-shaped connectors reversed to that of the cable-side connector.

Furthermore, according to the present invention, for the each cable-side connector, a GND surface and a signal line form a microstrip structure or a strip structure, the GND surface being connected to an outer conductor of each cable constituting the cable group, the signal line being connected to an internal conductor of the each cable.

These and other objects, features and advantages of the invention will be apparent from the following more particular description of preferred embodiments of the invention, as illustrated in the accompanying drawings.

BRIEF DESCRIPTION OF THE DRAWINGS

FIG. 5 is a perspective view illustrating one embodiment of a positioning mechanism for positioning and mounting a cable-side connector on a rod-shaped fixing member that is fixed to a housing in the horizontal direction according to the present invention;

FIG. 7 is a diagram illustrating, as a high-speed signal transmission apparatus according to a third embodiment of the present invention, a state in which each cable-side connector formed by layering wafer-shaped connectors on one another is fitted into a stationary plate, the state being viewed from the cable group side;

FIG. 9 is a diagram illustrating, as a high-speed signal transmission apparatus according to a fourth embodiment of the present invention, a state in which wafer-shaped connectors are layered on one another to form a layered product, and the layered product is divided on a cable group (cable bundle) basis to form each cable-side connector, and the each cable-side connector which is the divided layered product is then fitted into a stationary plate, the state being viewed from the cable group side;

DESCRIPTION OF THE PREFERRED EMBODIMENTS

Embodiments of high-speed signal transmission apparatus such as a server, a router, a storage unit, or an image processing apparatus according to the present invention will be described with reference to drawings.

First Embodiment

Figure 1:
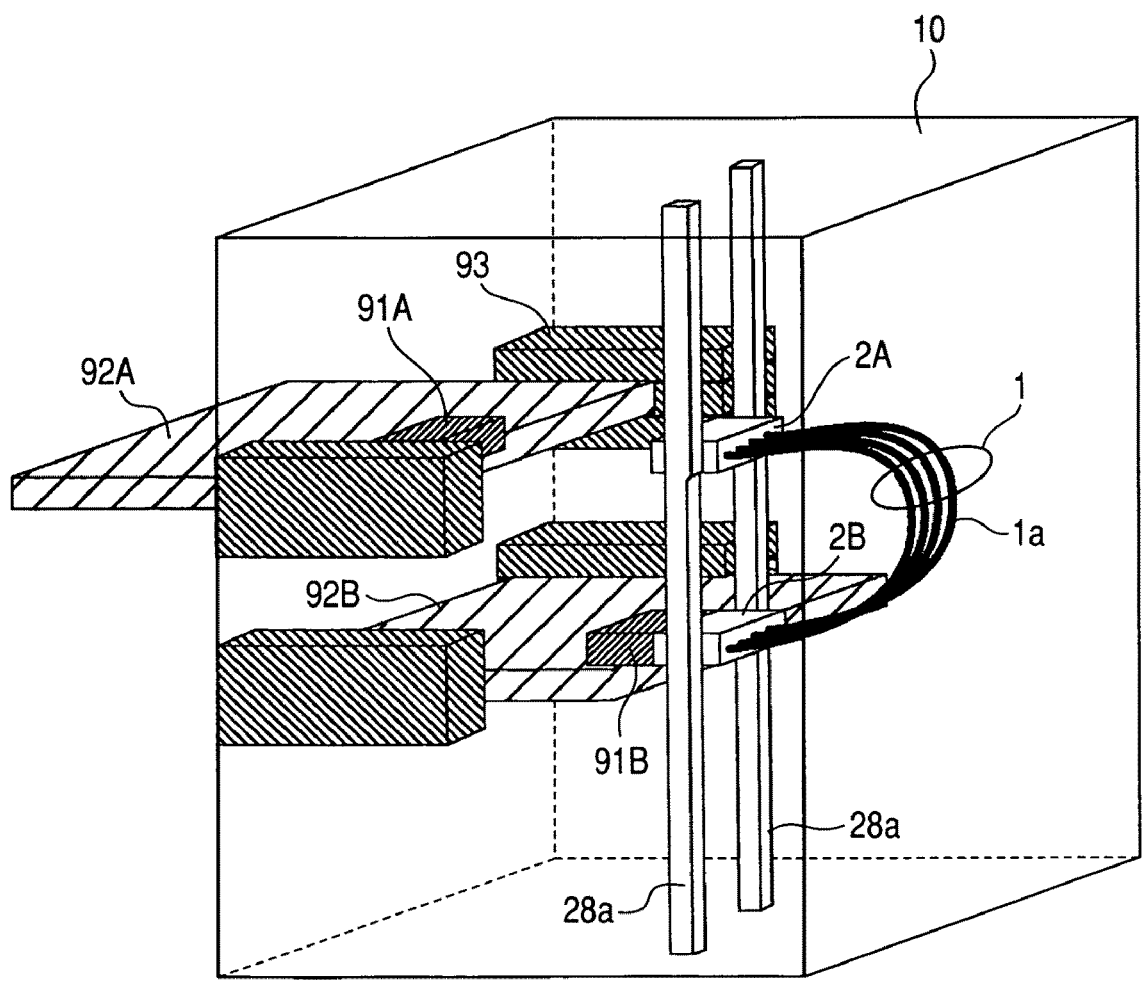
FIG. 1 is a perspective view schematically illustrating the configuration of a high-speed signal transmission apparatus according to a first embodiment of the present invention.
Figure 2A:
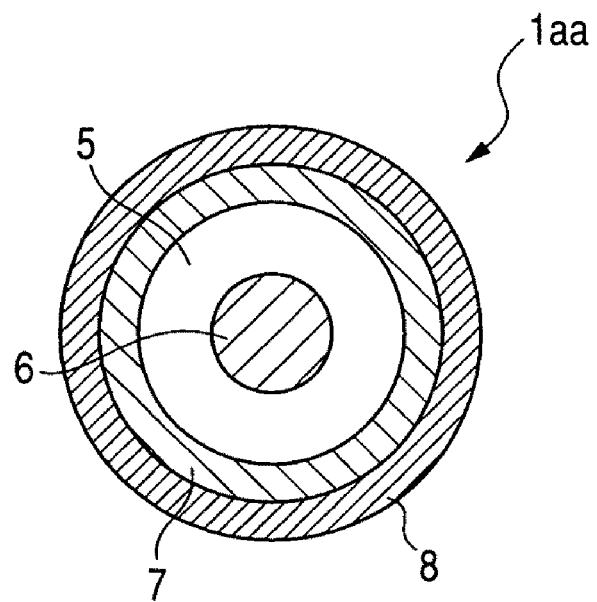
FIG. 2A is a diagram illustrating a cross section of a coaxial cable to be connected between cable-side connectors according to the present invention.
Figure 2B:
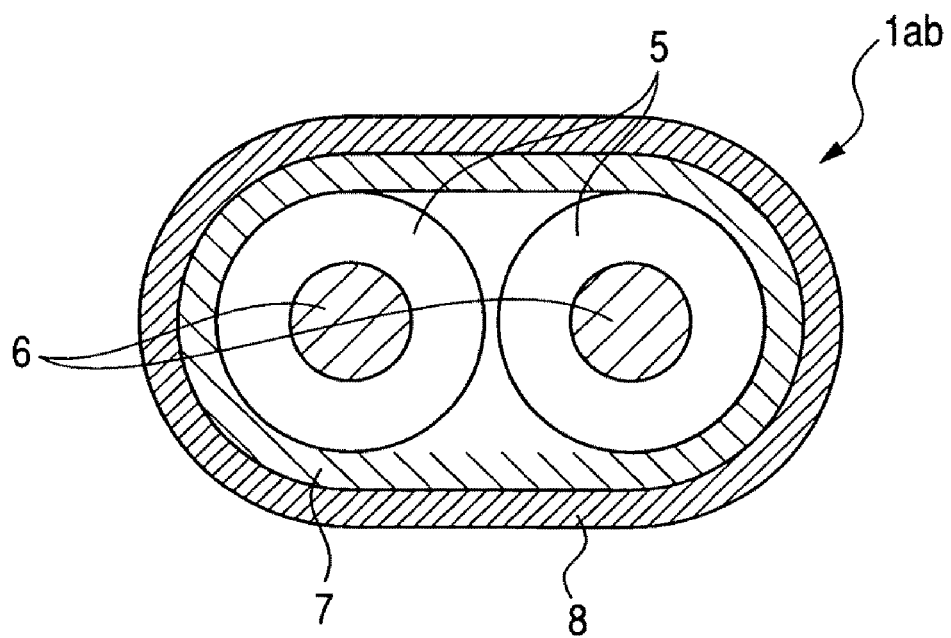
FIG. 2B is a diagram illustrating a cross section of a twinax cable to be connected between cable-side connectors according to the present invention.
Figure 3:
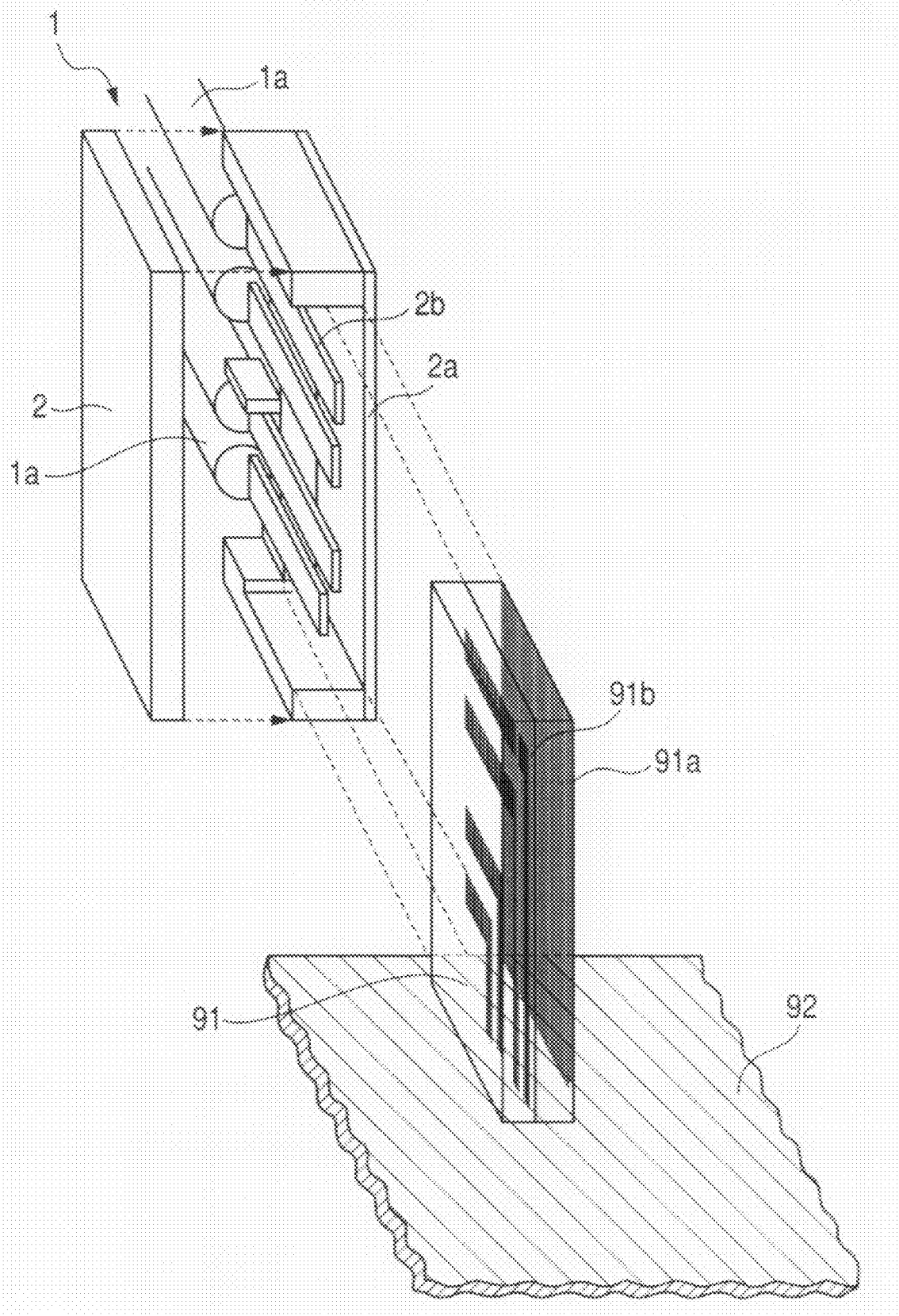
FIG. 3 is a perspective view illustrating one embodiment of a cable-side connector and a board-side connector according to the present invention.

Elements in a housing, which constitute a high-speed signal transmission apparatus according to a first embodiment of the present invention, will be described with reference to FIGS. 1 through 3. As shown in FIG. 1, a housing 10 accommodates elements constituting a high-speed signal transmission apparatus according to the present invention. A plurality of daughter boards 92A, 92B are formed by printed circuit boards equipped with semiconductor integrated circuits (not illustrated). The daughter boards 92A, 92B which are connected to connectors on the daughter board side (daughter-side connectors) 91A, 91B respectively, are juxtaposed to each other in such a manner that the daughter boards 92A, 92B can be inserted and removed along each daughter rail 93. As a result, a high-speed signal whose transmission speed is about from several Gbps to 20 Gbps is transmitted, through a signal line (not illustrated), from a communication unit (not illustrated) that is formed of, for example, a Serdes circuit of the semiconductor integrated circuit. There are provided a plurality of rod-shaped fixing members 28a in the longitudinal direction in which, for example, the daughter boards 92 are juxtaposed to each other. The rod-shaped fixing members 28a are used to precisely position and fix, to the same housing 10, each of cable connectors 2A, 2B into which the daughter board connectors 91A, 91B are fitted respectively. A connection between the cable-side connector 2A and the cable-side connector 2B is made with a cable bundle 1 constituted of a plurality of cables 1a that are juxtaposed to one another. Each of the cables 1a is formed of a coaxial cable 1aa (shown in FIG. 2A), a twinax cable 1ab (shown in FIG. 2B), or the like. These cables are capable of achieving the impedance matching, which makes it possible to decrease the transmission loss in the high-speed signal transmission. Incidentally, it is assumed that in order to keep the impedance of the cable bundle (cable group) 1 constituted of the plurality of cables 1a matched, a bending radius of the cable bundle 1 is about five times the cross-section radius r of each cable 1a or more. In addition, in the coaxial cable 1aa shown in FIG. 2A, and in the twinax cable 1ab shown in FIG. 2B, reference numeral 5 denotes a dielectric; reference numeral 6 denotes an internal conductor (core wire); reference numeral 7 denotes an outer conductor; and reference numeral 8 denotes an insulator. Moreover, illustration of wiring from the inside to the outside of the housing will be omitted in FIG. 1.

To be more specific, the first embodiment is so configured that a connection between the board-side connector 91A of the daughter board 92A and the board-side connector 91B of the daughter board 92B is made by a high-speed signal transmission line, the daughter boards 92A, 92B being equipped with a semiconductor integrated circuit for transmitting a high-speed signal, whose transmission speed is about from several Gbps to 20 Gbps, from the communication unit that is formed of, for example, a Serdes circuit. The high-speed signal transmission line includes: the cable bundle (cable group) 1 that is formed of a bundle of coaxial cables 1aa, a bundle of twinax cables 1ab, or the like, and that has, at both ends, the cable-side connectors 2A, 2B, each of which fits with each of the board-side connectors, the cables being capable of achieving the impedance matching, resulting in a small transmission loss; and the plurality of rod-shaped fixing members 28a that are provided in the longitudinal direction in which, for example, the daughter boards 92 are juxtaposed to each other, the rod-shaped fixing members 28a being used to precisely position and fix the cable-side connectors 2A, 2B, which are located at both ends, to the same housing (in particular, precisely position them in the horizontal direction). The board-side connectors 91A, 91B are fitted with the cable-side connectors 2A, 2B respectively, so that a high-speed signal is transmitted between the daughter board 92A and the daughter board 92B. The daughter rails 93 are disposed so that the daughter rails 93 hold both ends of each of the daughter boards 92 therebetween. Therefore, each of the daughter boards 92A, 92B can be inserted and removed only in the horizontal direction.

According to the first embodiment of the present invention, first of all, because the cable bundle (cable group) 1 constituted of the plurality of cables 1a such as the coaxial cable 1aa and the twinax cable 1ab, or the like, is used as a plurality of transmission media between the daughter boards 92A, 92B, the transmission loss is low (more specifically, the transmission loss is 8 dB/m at 5 GHz). Accordingly, it is possible to achieve the high-speed transmission whose transmission speed ranges from 10 to 20 Gbps. In addition, as shown in FIG. 3, the cable-side connector 2 disposed at both ends of the cable bundle 1 is formed of a connector whose polarity is reverse to that of the board-side connector 91; and no buffer substance such as a motherboard is located between the board-side connector 91 and the cable-side connector 2. Therefore, it is possible to achieve the impedance matching of the connectors. Moreover, there is no stub from a structural point of view, which enables the broad-band transmission. To be more specific, in the cable-side connector 2, the impedance matching between a GND (ground) surface 2a and the signal line 2b is performed across a dielectric (insulating layer) by use of a microstrip structure, a strip structure, or a coplanar structure. Here, the GND (ground) surface 2a is connected to the outer conductor 7 of each cable 1a with solder; and the signal line 2b is connected to the internal conductor (core wire) 6 of each cable 1a with solder. Each signal line 2b is connected to the core wire 6 of each cable 1a, such as a coaxial cable, whose impedance matching has been achieved in like manner. Next, a connection between the GND (ground) surface 2a of the connector 2 and an outer sheath GND (outer conductor) 7 of each cable 1a is made with the distance whose value is about 1 mm or less kept therebetween so that the impedance is kept matched on the connection surface. Incidentally, when the cable-side connector 2 and the board-side connector 91 are layered in the lateral direction, the number of pins can be increased. In this case, the GND surfaces 2a, 91a make it possible to prevent crosstalk from occurring between connectors that are adjacent to each other. Reference numeral 91b denotes each signal line of the board-side connector 91 corresponding to each signal line 2b of the cable-side connector 2. Moreover, because the cable-side connector 2 is precisely positioned and fixed to the housing by use of the plurality of rod-shaped fixing members 3, it is possible to align the cable-side connector 2 with the daughter board 92 whose height in the vertical direction is determined by the daughter rail 93. Accordingly, it is possible to insert and remove the connector by horizontally moving only the daughter board 92.

As described above, the high-speed signal transmission line according to the first embodiment uses the low-loss media. In addition to it, the high-speed signal transmission line is capable of achieving the impedance matching, and has no stub from a structural point of view. Therefore, the long-distance transmission of a high-speed signal can be performed, or the transmission can be performed at low error rate. Moreover, because the cable-side connectors are precisely fixed, the board-side connectors 91 can conveniently be inserted/removed into/from the cable-side connectors 2 by horizontally moving only the daughter boards. Furthermore, when the length of the transmission line, which is formed by the cable bundle 1 used to make a connection between the daughter boards, is configured in a substantially isometric manner, it is possible to equalize the signal propagation time and the propagation loss in all transmission lines. Therefore, it is possible to simplify the configuration of a transmit-receive circuit.

Second Embodiment

Figure 4:
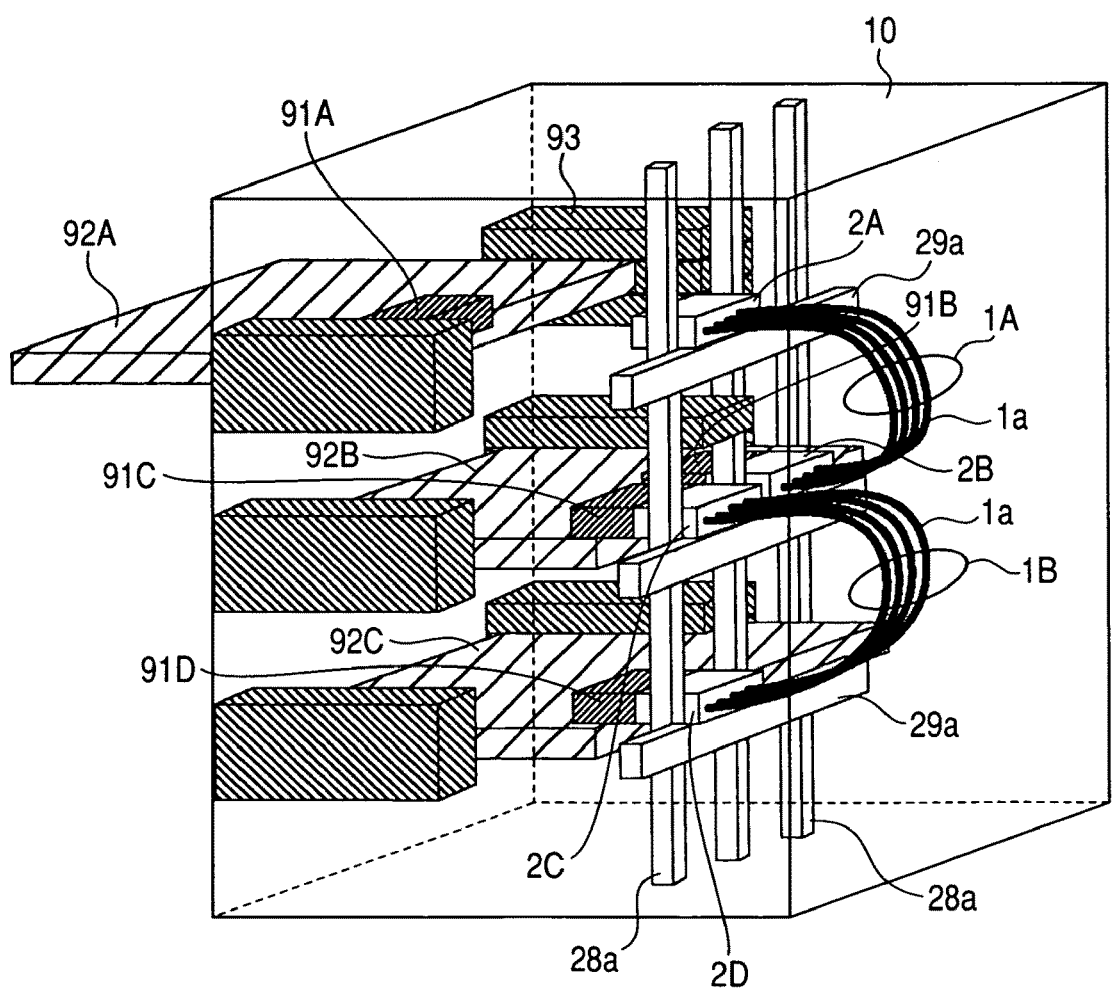
FIG. 4 is a perspective view schematically illustrating the configuration of a high-speed signal transmission apparatus according to a second embodiment of the present invention.

Next, elements in a housing, which constitute a high-speed signal transmission apparatus according to a second embodiment of the present invention, will be described with reference to FIGS. 4 through 6. According to the second embodiment of the present invention, as shown in FIG. 4, points of difference between the first and second embodiments are as follows: three or more daughter boards 92A through 92C are juxtaposed to one another in the housing 10; the number of cable bundles (cable groups) 1A, 1B, each of which is used to make a connection between the daughter boards, increases, and accordingly, the number of board-side connectors 91A through 91D and the number of cable-side connectors 2A through 2D also increase; and there is provided a rod-shaped fixing member 29a in the lateral direction that is, for example, a surface direction of the daughter board 92, the rod-shaped fixing member 29a being used to position, for example, the cable-side connectors 2B, 2C, the number of which has been increased, and to fix the cable-side connectors 2B, 2C to the housing 10. Specifically, according to the second embodiment of the present invention, in order to form a server or a router, another daughter board 92B is connected to the plurality of daughter boards 92A, 92C by use of cable bundles (cable group) 1A, 1B, each of which is constituted of the plurality of cables 1a such as the coaxial cable 1aa (shown in FIG. 2A) and the twinax cable 1ab (shown in FIG. 2B) such that the high-speed signal transmission can be performed. The plurality of daughter boards 92A, 92C are juxtaposed to each other in the housing 10 and the plurality of cables 1a are capable of achieving the impedance matching. This makes it possible to decrease the transmission loss. In addition, according to the second embodiment of the present invention, in order to precisely position the cable-side connectors 2B, 2C to achieve the precise positional relationship therebetween, rod-shaped fixing members 29a are disposed in the horizontal direction (lateral direction) that is orthogonal to the rod-shaped fixing member 28a. Incidentally, FIG. 4 is a diagram illustrating the rod-shaped fixing members 29a that are disposed in the horizontal direction (lateral direction) with respect to the plurality of daughter boards 92A through 92C in the housing 10. This is because there is a possibility that the plurality of cable-side connectors 2 will be juxtaposed to one another on each of the rod-shaped fixing members 29a on a daughter board 92 basis.

FIG. 5 is a perspective view illustrating one embodiment of a mechanism (positioning mechanism) for positioning the cable-side connector 2 on each of the rod-shaped fixing members 29a, and a method thereof. To be more specific, the mechanism (positioning mechanism) for positioning the cable-side connector 2 and the method thereof are mechanism and method for providing each of the cable-side connector 2 and the rod-shaped fixing member 29a with positioning holes, and then for inserting positioning sticks 4 into the positioning holes. This makes it possible to achieve precise alignment.

Incidentally, the number of daughter boards 92 disposed in the housing 10 is not limited to three. Two or more daughter boards 92 may also be disposed in the housing 10. In addition, also for the connections in the housing 10 by use of the cable bundles 1 that are capable of achieving the impedance matching between the daughter boards, which makes it possible to decrease the transmission loss, as shown in for example FIGS. 6A and 6B, it is also possible to make connections over the plurality of daughter boards to the plurality of daughter boards.

Figure 6A:
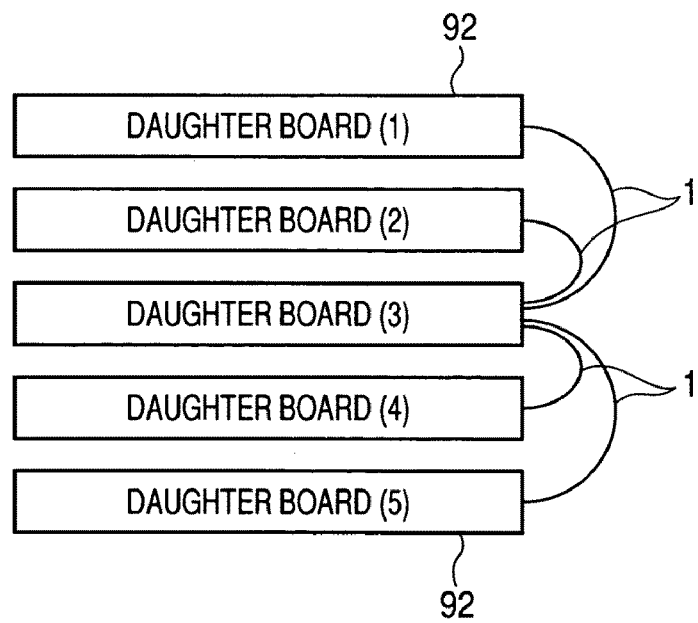
FIGS. 6A and 6B are diagrams each illustrating an embodiment in which a plurality of daughter boards are juxtaposed to one another in a housing, and connections between the juxtaposed daughter boards are then made by use of cable groups (cable bundles) according to the present invention.

FIG. 6A is a diagram illustrating a case where a main daughter board (3) is connected to each of daughter boards (1), (2), (4), (5) by use of cable bundles (cable groups) 1. In this case, the number of sets of the board-side connectors 91 and the cable-side connectors 2, which are allocated to the main daughter board (3), is about four times the number of sets of the board-side connectors 91 and the cable-side connectors 2 that are allocated to each of the daughter boards (1), (2), (4), (5). Thus, when the plurality of cable-side connectors 2 used for the main daughter board (3) are fixed to the rod-shaped fixing member 29a placed in the horizontal direction (lateral direction) with the plurality of cable-side connectors 2 juxtaposed to one another, the cable-side connectors can be positioned with high precision. As a result, when the main daughter board (3) is guided along the daughter rails 93 such that the main daughter board (3) moves in the horizontal direction, it is possible to conveniently insert/remove the main daughter board (3). Moreover, when the length of the transmission line, which is formed by the cable bundle 1 used to make a connection between the daughter boards, is configured in a substantially isometric manner, it is possible to equalize the signal propagation time and the propagation loss in all transmission lines. Therefore, it is possible to simplify the configuration of the transmit-receive circuit.

Figure 6B:
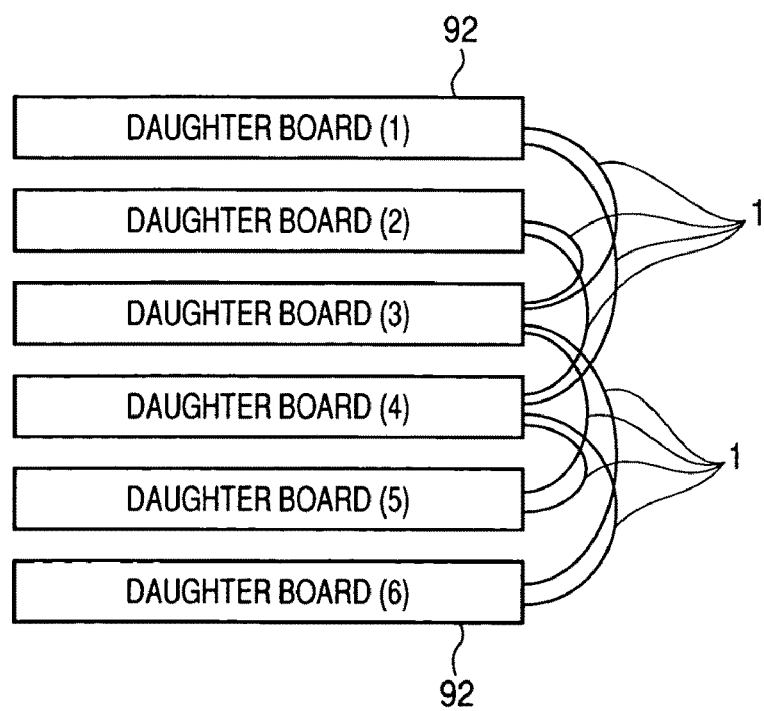

In addition, FIG. 6B is a diagram illustrating a case where the number of main daughter boards (3), (4) is two, and the main daughter board (3) is connected to each of daughter boards (1), (2), (5), (6) by use of cable bundles (cable group) 1, whereas the main daughter board (4) is connected to each of the daughter boards (1), (2), (5), (6) by use of cable bundles (cable group) 1. In this case, because the number of main daughter boards (3), (4) is two, the number of sets of the board-side connector 91 and the cable-side connector 2, which are allocated to the main daughter board (3), is about twice the number of sets of the board-side connector 91 and the cable-side connector 2 that are allocated to each of the daughter boards (1), (2), (5), (6). In a similar manner, the number of sets of the board-side connector 91 and the cable-side connector 2, which are allocated to the main daughter board (4), is about twice the number of sets of the board-side connector 91 and the cable-side connector 2 that are allocated to each of the daughter boards (1), (2), (5), (6). Thus, when the plurality of cable-side connectors 2 used for each of the main daughter boards (3), (4) are fixed to the rod-shaped fixing member 29a placed in the horizontal direction (lateral direction) with the plurality of cable-side connectors 2 juxtaposed to one another, the cable-side connectors can be positioned with high precision. As a result, each of the main daughter boards (3), (4) is guided along the daughter rails 93 such that each of the main daughter boards (3), (4) moves in the horizontal direction, it is possible to conveniently insert/remove each of the main daughter boards (3), (4). As a matter of course, if the plurality of cable-side connectors 2 are used for each of the daughter boards (1), (2), (5), (6), by fixing the plurality of cable-side connectors 2 to the rod-shaped fixing member 29a placed in the horizontal direction (lateral direction) with the plurality of cable-side connectors 2 juxtaposed to one another, the cable-side connectors can be positioned with high precision. As a result, when each of the daughter boards (1), (2), (5), (6) is guided along the daughter rails 93 such that the daughter boards move in the horizontal direction, it is possible to conveniently insert/remove each of the daughter boards (1), (2), (5), (6). Moreover, when the length of the transmission line, which is formed by the cable bundle (cable group) 1 used to make a connection between the daughter boards, is configured in a substantially isometric manner, it is possible to equalize the signal propagation time and the propagation loss in all transmission lines. Therefore, it is possible to simplify the configuration of the transmit-receive circuit.

As described above, according to the second embodiment, in addition to the effects exhibited by the first embodiment, it is also possible to achieve the high-speed signal transmission between the plurality of daughter boards.

Third Embodiment

Figure 8:
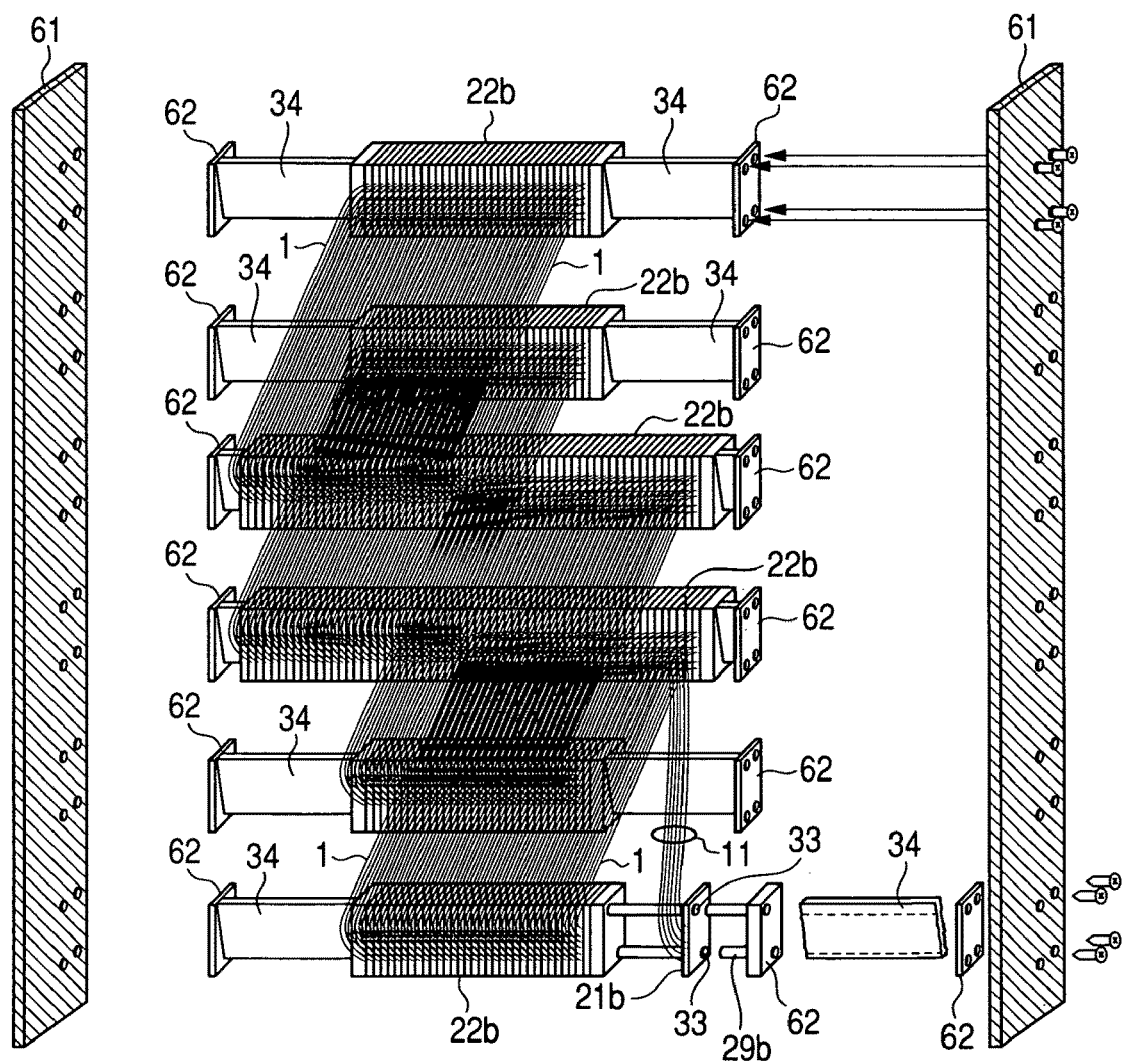
FIG. 8 is a diagram illustrating, as a modification of the high-speed signal transmission apparatus according to the third embodiment of the present invention, a state in which a plurality of rod-shaped fixing members are inserted into each cable-side connector formed by layering wafer-shaped connectors on one another so that the each cable-side connector is fixed to right and left stationary plates, the state being viewed from the cable group side.

Next, elements in a housing, which constitute a high-speed signal transmission apparatus according to a third embodiment of the present invention, will be described with reference to FIGS. 7 and 8. To be more specific, according to the third embodiment of the present invention, as shown in FIG. 7, points of difference between the second and third embodiments are that instead of the rod-shaped fixing members 28a, 29a, there is provided a stationary plate 28b that is fixed to the housing 10, and that instead of the cable-side connector 2, the cable-side connector block 22a, which is formed by layering wafer-shaped connectors 21a on one another in the lateral direction, is placed into the connector groove 31 formed on the stationary plate 28b. As shown in FIG. 3, each of the wafer-shaped connectors 21a is formed as a connector whose polarity is reverse to that of the board-side connector 91 that is formed by layering wafer-shaped connectors on one another in the lateral direction. In addition, for the wafer-shaped connector 21a, the impedance matching between the GND surface 2a and the signal line 2b is performed across a dielectric (insulating layer) by use of the microstrip structure or the strip structure. Here, the GND surface 2a is connected to the outer conductor 7 of each cable 1a with solder; and the signal line 2b is connected to the internal conductor (core wire) 6 of each cable 1a with solder. Each signal line 2b is connected to the core wire 6 of each cable 1a, such as a coaxial cable, whose impedance matching has been achieved in like manner. Moreover, a connection between the GND surface 2a of the connector 21a and the outer sheath GND 7 of each cable 1a is made with the distance whose value is about 1 mm or less kept therebetween so that the impedance is kept matched on the connection surface. As a matter of course, a connection between the wafer-shaped connectors 21a is made by the cable bundle 11 that is constituted of the plurality of cables 1a on a wafer basis. In addition, the board-side connector 19 is fitted into the cable-side connector block 22a that is fixedly placed into the connector groove 31 of the stationary plate 28b. Accordingly, a connection between the daughter boards is made by use of the cable bundle (cable group) 1 that is capable of achieving the impedance matching, which makes it possible to decrease the transmission loss. Therefore, it is possible to achieve the high-speed signal transmission.

FIG. 7 is a diagram illustrating a case where six daughter boards (1) through (6) are juxtaposed to one another in the housing as shown in FIG. 6B. In this case, two main daughter boards (3), (4) are provided. The main daughter board (3) is connected to each of daughter boards (1), (2), (5), (6) by use of cable bundles (cable groups) 1; and the main daughter board (4) is connected to each of the daughter boards (1), (2), (5), (6) by use of cable bundles 1. In this case, because the number of main daughter boards (3), (4) is two, the number of sets of the board-side connector 91 and the cable-side connector block 22a on a cable bundle basis, which are allocated to the main daughter board (3) is about twice (four sets) the number of sets (two sets) of the board-side connector 91 and the cable-side connector block 22a on a cable bundle basis, which are allocated to each of the daughter boards (1), (2), (5), (6). In a similar manner, the number of sets of the board-side connector 91 and the cable-side connector block 22a, which are allocated to the main daughter board (4) is about twice (four sets) the number of sets (two sets) of the board-side connector 91 and the cable-side connector block 22a on a cable bundle basis, which are allocated to each of the daughter boards (1), (2), (5), (6). Thus, when the plurality of cable-side connector blocks 22a used for each of the main daughter boards (3), (4) are fixed to the stationary plate 28b in the horizontal direction (lateral direction) with the plurality of cable-side connector blocks 22a juxtaposed to one another, the cable-side connector blocks can be positioned with high precision. As a result, when each of the main daughter boards (3), (4) is guided along the daughter rails 93 such that each of the main daughter boards (3), (4) moves in the horizontal direction, it is possible to conveniently insert/remove the board-side connector 91. As a matter of course, if the plurality of cable-side connector blocks 22a are used for each of the daughter boards (1), (2), (5), (6), by fixing the plurality of cable-side connector blocks 22a to the stationary plate 28b in the horizontal direction (lateral direction) with the plurality of cable-side connector blocks 22a juxtaposed to one another, the cable-side connector blocks can be positioned with high precision. As a result, when each of the daughter boards (1), (2), (5), (6) is guided along the daughter rails 93 such that the daughter boards move in the horizontal direction, it is possible to conveniently insert/remove the board-side connector 91. Moreover, when the length of the transmission line, which is formed by the cable bundle 1 used to make a connection between the daughter boards, is configured in a substantially isometric manner, it is possible to equalize the signal propagation time and the propagation loss in all transmission lines. Therefore, it is possible to simplify the configuration of the transmit-receive circuit.

To be more specific, according to the third embodiment, the wafer-shaped connectors 21b, which are used to connect on a wafer basis the cable bundle 11 constituted of the plurality of cables 1a, are layered on one another in the lateral direction so that the cable-side connector described in the second embodiment is formed as the cable-side connector block 22b. Moreover, the cable-side connector block 22b is fitted into the connector groove 31 formed in the stationary plate 28b corresponding to an array of board-side connectors 91 of the daughter board 92. As a result, it is possible to improve the assemblability. Therefore, this configuration is particularly suitable for a case where the number of cables is large. In addition, because the connector has a wafer shape, a signal terminal of the signal line 2b inside the connector will never be shaded by signal terminals of other signal lines 2b as shown in FIG. 3. Accordingly, it is possible to easily make a connection to the cable 1a, and to easily perform processing of achieving the impedance matching between connected portions. Therefore, it is possible to improve the transmission characteristics. According to the third embodiment, in addition to the effects exhibited by the second embodiment, it is possible to achieve the high assemblability, and it is also possible to achieve the excellent transmission characteristics.

Next, a modification of the third embodiment according to the present invention will be described with reference to FIG. 8. To be more specific, according to the modification of the third embodiment, corresponding to each of a plurality of daughter boards that are juxtaposed to one another in the housing 10, there are provided elements including: the cable bundle (cable group) 1 in which the wafer-shaped connectors 21b are layered on one another, the cable bundle 1 having the cable-side connector blocks 22b at both ends; two or more rod-shaped fixing members 29b for gathering the wafer-shaped connectors 21b together with high precision by inserting the rod-shaped fixing members 29b through the positioning holes 33 of the wafer-shaped connector 21b; right and left side plates 62 for fixing the two or more rod-shaped fixing members 29b together at the right and left ends thereof; and alignment plates 34, each of which is used to align a position of the cable-side connector block 22b by putting the alignment plate 34 between the right or left side plate 62 and the cable-side connector block 22b. Moreover, there are provided right and left stationary plates 61 for fixing the right and left side plates 62 to the housing 10 respectively.

Thus, according to the modification of the third embodiment, in contrast with the third embodiment shown in FIG. 7, the rod-shaped fixing members 29b are inserted through the positioning holes 33 of the wafer-shaped connector 21b. Therefore, it is possible to produce the effects that are similar to those of the third embodiment shown in FIG. 7.

Fourth Embodiment

Figure 10:
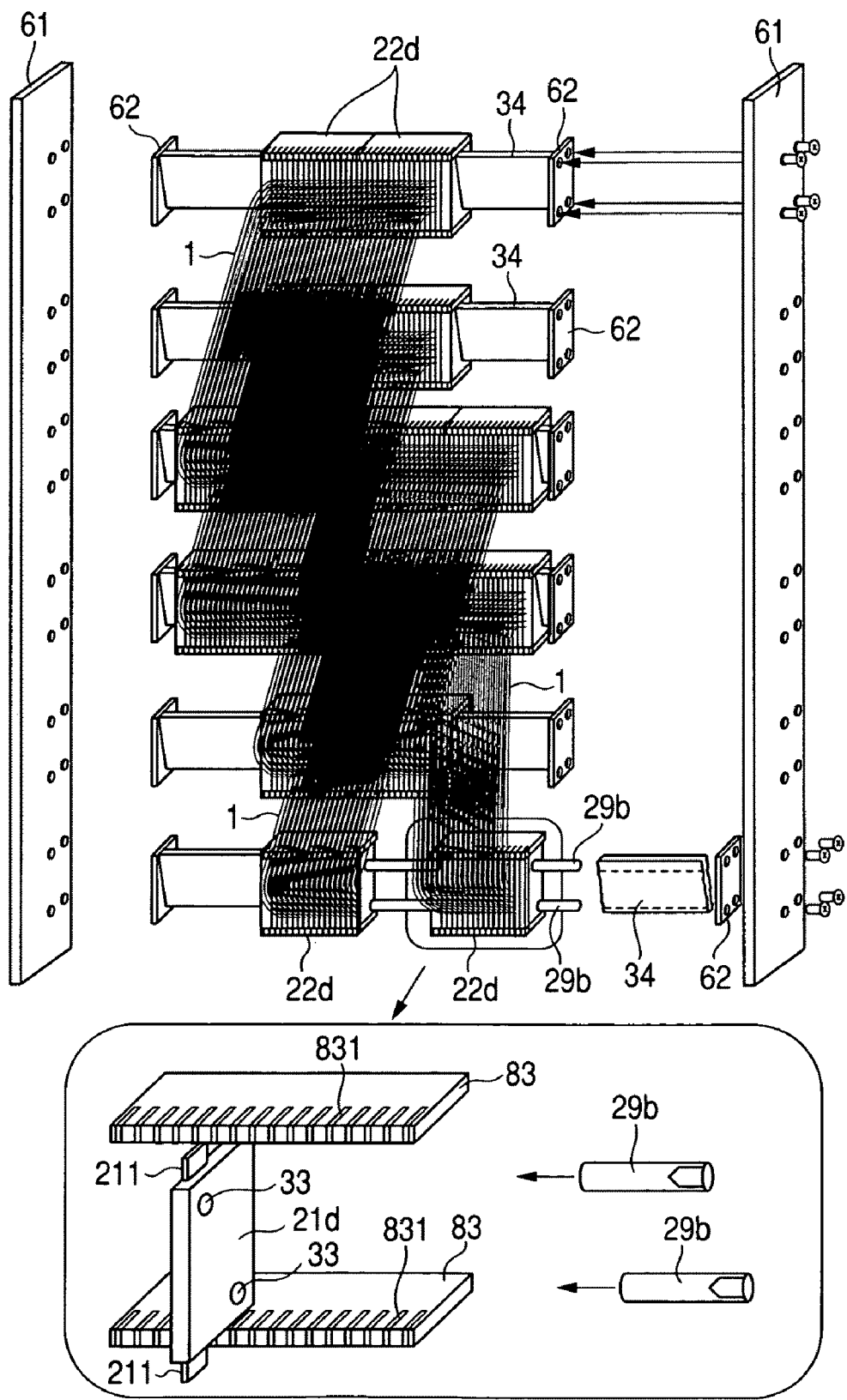
FIG. 10 is a diagram illustrating, as a modification of the high-speed signal transmission apparatus according to the fourth embodiment of the present invention, a state in which wafer-shaped connectors are layered on one another to form a layered product, and the layered product is divided on a cable group (cable bundle) basis to form each cable-side connector, and a plurality of rod-shaped fixing members are then inserted into the each cable-side connector which is the divided layered product so that the each cable-side connector is fixed to right and left stationary plates, the state being viewed from the cable group side.

Next, elements in a housing, which constitute a high-speed signal transmission apparatus according to a fourth embodiment of the present invention, will be described with reference to FIGS. 9 and 10. To be more specific, according to the fourth embodiment of the present invention, points of difference between the third and fourth embodiments are as follows: as shown in FIG. 9, there is provided the stationary plate 28b that is fixed to the housing 10; the cable-side connector block, which is formed by layering the wafer-shaped connectors 21c on one another, is divided, for example, on a cable bundle (cable group) 1 basis, the cable bundle 1 connecting between the daughter boards 1; the divided cable-side connector blocks 22c are then placed on connector connection plates 81 that are formed on the upper and lower parts, each of the connector connection plates 81 having an L-character cross-sectional shape; and the connector connection plates 81 are inserted into an alignment hole 35 of the stationary plate 28b with the connector connection plates 81 positioned by positioning pins 82 so that the connector connection plates 81 are fixed to the stationary plate 28b. However, when tongues 211, which are formed at the upper and lower ends of each wafer-shaped connector 21c, are fitted into grooves 811 with which each of the upper and lower connector connection plates 81 are provided, the plurality of wafer-shaped connectors 21c are collectively placed on the connector connection plates 81 with the wafer-shaped connectors 21c layered on one another.

Thus, according to the fourth embodiment, in contrast with the third embodiment shown in FIG. 7, it is so configured that the plurality of wafer-shaped connectors 21c are gathered together on a connector bundle 1 basis by use of the connector connection plates 81, before the wafer-shaped connectors 21c are fitted into the stationary plate 28b. Therefore, it is possible to further improve the assemblability. The configuration according to the fourth embodiment is particularly suitable for a case where the number of cables is large, and at the same time, the number of cables used to connect transmission lines between the same daughter boards is large.

Next, a modification of the fourth embodiment will be described with reference to FIG. 10. To be more specific, according to the modification of the fourth embodiment, the cable-side connector block, which is formed by layering the wafer-shaped connectors 21d on one another, is collectively divided (blocked) on a cable bundle (cable group) 1 basis, and the divided cable-side connector blocks 22d are then placed on connector connection plates 82 that are formed on the upper and lower parts. Next, according to the modification of the fourth embodiment, corresponding to each of a plurality of daughter boards that are juxtaposed to one another in the housing 10, there are provided elements including: two or more rod-shaped fixing members 29b for gathering the wafer-shaped connectors 21d together with high precision on a connector connection plate 82 basis by inserting the rod-shaped fixing members 29b through the positioning holes 33 of the wafer-shaped connectors 21d; right and left side plates 62 for fixing the two or more rod-shaped fixing members 29b at the right and left ends thereof; and alignment plates 34, each of which is used to align a position of the cable-side connector block 22d by putting the alignment plate 34 between the right or left side plate 62 and the cable-side connector block 22d. Moreover, there are provided right and left stationary plates 61 for fixing the right and left side plates 62 to the housing 10 respectively. However, the tongues 211, which are formed at the upper and lower ends of each wafer-shaped connector 21d, are fitted into the grooves 811 with which each of the upper and lower connector connection plates 83 are provided, the plurality of wafer-shaped connectors 21d are collectively placed on the connector connection plates 83 with the wafer-shaped connectors 21d layered on one another.

Thus, according to the modification of the fourth embodiment, it is so configured that the plurality of wafer-shaped connector wafers 21d are gathered together into each connector bundle by use of the connector connection plate 83, before the wafer-shaped connector wafers 21d are inserted into the rod-shaped fixing member 29b. Therefore, it is possible to further improve the assemblability. This configuration is particularly suitable for a case where the number of cables is large, and at the same time, the number of cables used to connect transmission lines between the same daughter boards is large.

As described above, according to the fourth embodiment, in addition to the effects exhibited by the third embodiment, it is possible to further improve the assemblability.

Fifth Embodiment

Figure 11:
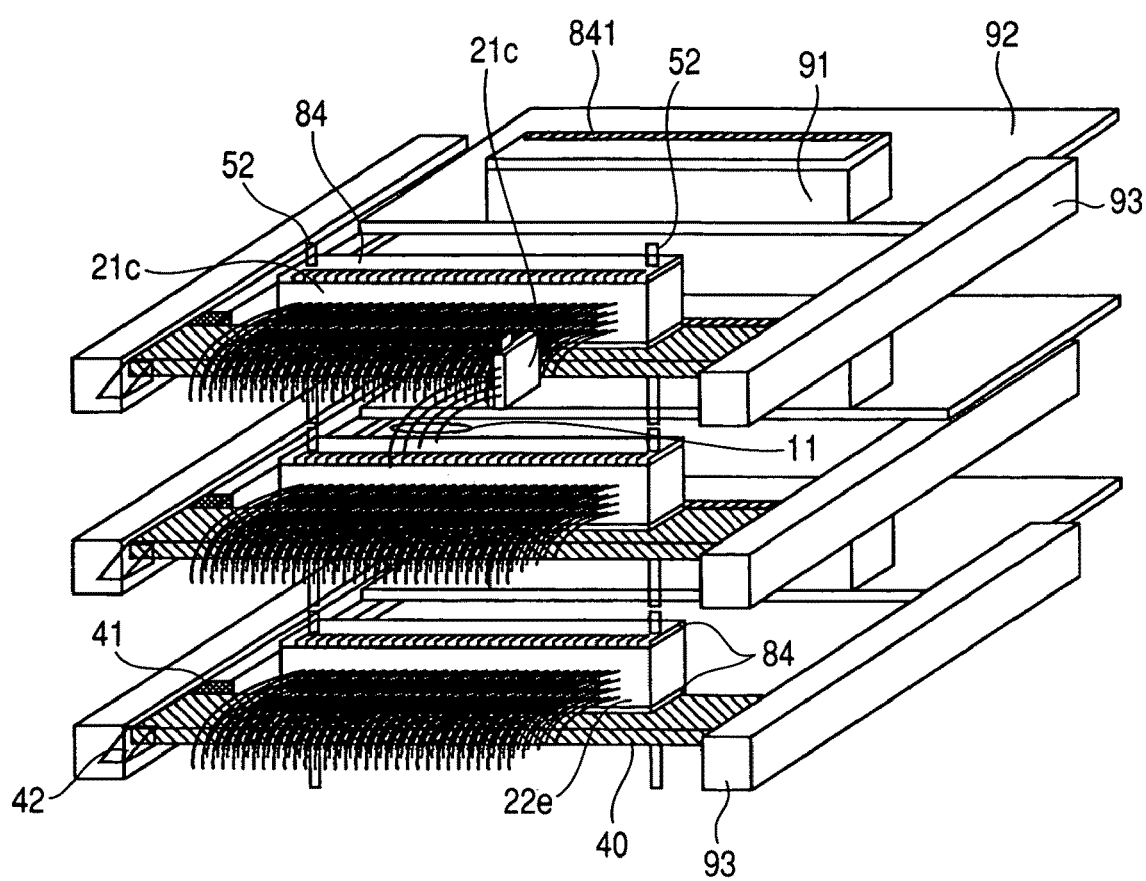
FIG. 11 is a perspective view illustrating as a whole high-speed signal transmission apparatus according to a fifth embodiment of the present invention, the high-speed signal transmission apparatus being viewed from the cable group side.

Next, elements in a housing, which constitute a high-speed signal transmission apparatus according to a fifth embodiment of the present invention, will be described with reference to FIG. 11. To be more specific, according to the fifth embodiment of the present invention, points of difference between the fourth and fifth embodiments are as follows: as shown in FIG. 11, there is provided a cable-side connector block 22e in which the tongues 211 of the plurality of wafer-shaped connectors 21c are fitted into the grooves 841 with which the connector connection plates 84 are provided, the connector connection plates 84 being located on the upper and lower parts, the plurality of wafer-shaped connectors 21c being layered on one another in the lateral direction so that the plurality of wafer-shaped connectors 21c are gathered together on a daughter board basis; each of the cable-side connector blocks 22e is placed on each positioned plate member (each stationary plate) 40 by use of a stopper 41 and a reversion protection spring 42 that are embedded into each daughter rail 93 fixed to the housing associated with the daughter board 92; and by inserting the positioning pin 52 into each connector connection plate 84 and each plate member 40, the positioning precision of each cable-side connector block 22e in the lateral direction (horizontal direction) is kept high with respect to the daughter rail 93 for guiding each daughter board 92 in the horizontal direction.

Thus, according to the fifth embodiment, it is so configured that by inserting the positioning pin 52 into each plate member (each stationary plate) 40 that is positioned with respect to each daughter rail 93, each of the cable-side connector blocks 22e is positioned and placed in the lateral direction. Therefore, it is possible to easily insert/remove the board-side connector 91, which is provided (mounted) on each daughter board 92, into/from each cable-side connector block 22e to which the cable bundle 1 is connected. This configuration is in particular suitable for a case where the number of daughter boards is large. Moreover, it is possible to increase and decrease the number of plate members 40 in response to the number of daughter boards 92. In addition to the effects exhibited by the second embodiment, it is possible to achieve the high assemblability, and to carry out the extension in response to the number of daughter boards.

The invention made by this inventor was specifically described on the basis of the embodiments as above. However, the present invention is not limited to the above-described embodiments. The present invention can be changed in various ways within the range that does not deviate from points thereof. Great effects are produced when the present invention is used for high-speed signal transmission apparatus such as a server, a router, a storage unit, or an image processing apparatus, the high-speed signal transmission apparatus mainly using the serial transmission technology inside the transmission equipment. However, the present invention can also be used for communications in other telecommunication equipment, or for various kinds of measuring instruments, or the like, that require the transmission of a high-speed signal.

According to the present invention, because a high-speed signal can be transmitted with lower loss than that in the prior art, it becomes possible to extend the transmission distance between daughter boards. As a result, it is possible to increase the number of daughter boards that can be accommodated in the same housing.

In addition, according to the present invention, because it is possible to eliminate the need for a loss compensation circuit with which a transmitting circuit and a receiving circuit are conventionally equipped to perform the long-distance transmission, it becomes possible to reduce the power consumption, and to improve the circuit packaging density.

Moreover, according to the present invention, because it is possible to configure the length of each transmission line between daughter boards to be substantially isometric, it becomes possible to equalize the signal propagation time and the propagation loss in all transmission lines. Therefore, it is possible to eliminate the need for individually adjusting, on a propagation path basis, the dispersion caused by the transmission.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A high-speed signal transmission apparatus comprising:
a housing;
a plurality of daughter boards juxtaposed to one another in the housing;
board-side connectors each provided on corresponding each of the juxtaposed daughter boards; and
cable-side connectors fixed in the housing;
wherein each of the board-side connectors is insertable/removable into/from corresponding each of the cable-side connectors, and
wherein a cable group whose impedance matching can be achieved makes connection between the predetermined cable-side connectors,
said each cable-side connector is formed by layering wafer-shaped connectors on one another, and
wherein rod-shaped fixing members are inserted into a plurality of positioning holes, with which each of the wafer-shaped connectors is provided, so that the wafer-shaped connectors are layered on one another and gathered together on a cable group basis to form a layered product, the cable group being used to connected between the cable-side connectors; and
the layered product into which the wafer-shaped connectors are gathered together is positioned and mounted to a stationary plate that is fixed to the housing.

2. The high-speed signal transmission apparatus according to claim 1, wherein:
said cable group is constituted of a plurality of coaxial cables or a plurality of twinax cables.

3. The high-speed signal transmission apparatus according to claim 1, wherein:
two or more sets of the board-side connectors and cable-side connectors into/from which the board-side connectors can be inserted/removed are provided for a predetermined daughter board; and a positioning mechanism for defining a position between the cable-side connectors so as to be suitable for a spacing between the board-side connectors, is provided in the housing.

4. The high-speed signal transmission apparatus according to claim 1, wherein:
a daughter rail for guiding each of the plurality of daughter boards so that the board-side connector provided on each of the plurality of daughter boards can be inserted/removed into/from the cable-side connector fixed in the housing, is provided in the housing.

5. The high-speed signal transmission apparatus according to claim 1, wherein:
said wafer-shaped connectors are layered on one another so that the layered wafer-shaped connectors are gathered together on a cable group basis to form a layered product, the cable group being used to connect between the cable-side connectors; and the layered product into which the wafer-shaped connectors are gathered together is positioned and mounted to a stationary plate that is fixed to the housing.

6. The high-speed signal transmission apparatus according to claim 1, wherein:
said each board-side connector is formed by layering wafer-shaped connectors on one another with the polarity of the wafer-shaped connectors reversed to that of the cable-side connector.

7. A high-speed signal transmission apparatus comprising:
a housing;
a plurality of daughter boards juxtaposed to one another in the housing;
board-side connectors each provided on corresponding each of the juxtaposed daughter boards; and
cable-side connectors fixed in the housing;
wherein each of the board-side connectors is insertable/removable into/from corresponding each of the cable-side connections, and
wherein a cable group whose impedance matching can be achieved makes connection between the predetermined cable-side connectors,
and wherein:
for the each cable-side connector, a GND surface and a signal line form a microstrip structure, a strip structure, or a coplanar structure, the GND surface being connected to an outer conductor of each cable constituting the cable group, the signal line being connected to an internal conductor of the each cable.

8. The high-speed signal transmission apparatus according to claim 7, wherein:
said cable group is constituted of a plurality of coaxial cables or a plurality of twinax cables.

9. The high-speed signal transmission apparatus according to claim 7, wherein:
two or more sets of the board-side connectors and cable-side connectors into/from which the board-side connectors can be inserted/removed are provide for a predetermined daughter board; and a positioning mechanism for defining a position between the cable-side connectors so as to be suitable for a spacing between the board-side connectors, is provided in the housing.

10. The high-speed signal transmission apparatus according to claim 7, wherein:
a daughter rail for guiding each of the plurality of daughter boards so that the board-side connector provided on each of the plurality of daughter boards can be inserted/removed into/from the cable-side connector fixed in the housing, is provided in the housing.

* * * * *